US012129156B2

United States Patent
Perlstein et al.

(10) Patent No.: US 12,129,156 B2
(45) Date of Patent: Oct. 29, 2024

(54) APPARATUS AND METHOD OF VOLTAGE DETECTION OF VEHICLES ON A VEHICLE LIFT SYSTEM

(71) Applicant: Mohawk Lifts, LLC, Amsterdam, NY (US)

(72) Inventors: Zachary Perlstein, Amsterdam, NY (US); Sean Bicknell, Amsterdam, NY (US)

(73) Assignee: Mohawk Lifts, LLC, Amsterdam, NY (US)

( * ) Notice: Subject to any disclaimer, the term of this patent is extended or adjusted under 35 U.S.C. 154(b) by 275 days.

(21) Appl. No.: 17/662,132

(22) Filed: May 5, 2022

(65) Prior Publication Data

US 2022/0356053 A1 Nov. 10, 2022

Related U.S. Application Data

(60) Provisional application No. 63/185,721, filed on May 7, 2021.

(51) Int. Cl.
| | |
|---|---|
| B66F 17/00 | (2006.01) |
| B66F 7/06 | (2006.01) |
| B66F 7/20 | (2006.01) |
| G01R 22/06 | (2006.01) |
| G01R 31/52 | (2020.01) |
| G08B 7/06 | (2006.01) |

(52) U.S. Cl.
CPC ............ B66F 17/00 (2013.01); G01R 22/065 (2013.01); G01R 31/52 (2020.01); G08B 7/06 (2013.01); *B66F 7/065* (2013.01); *B66F 7/20* (2013.01)

(58) Field of Classification Search
None
See application file for complete search history.

(56) References Cited

U.S. PATENT DOCUMENTS

| | | | | | |
|---|---|---|---|---|---|
| 3,913,938 | A | * | 10/1975 | Aikawa | B60G 17/04 280/6.158 |
| 2017/0200335 | A1 | * | 7/2017 | Da Deppo | G07C 9/00309 |

* cited by examiner

*Primary Examiner* — Farhana A Hoque
(74) *Attorney, Agent, or Firm* — Stephen P. Scuderi; Heslin Rothenberg Farley & Mesiti P.C.

(57) ABSTRACT

A vehicle lift system includes a vehicle lift operable to lift a vehicle to be serviced by a technician. The vehicle lift includes lifting components for engaging and lifting the vehicle at liftable structures of the vehicle. Electrodes are positioned on the lifting components of the vehicle lift. The electrodes are operable to make electrical contact with the liftable structures of the vehicle when the lifting components engage the liftable structures. A voltage detector system is in electrical communication with the electrodes. The voltage detector system is operable to detect voltages at the electrodes capable of harming the technician. The voltage detector system is also operable to send a warning signal to the technician indicating that a harmful voltage has been detected on the electrodes when the electrodes make electrical contact with the liftable structures of the vehicle.

7 Claims, 8 Drawing Sheets

APPARATUS AND METHOD OF VOLTAGE DETECTION OF VEHICLES ON A VEHICLE LIFT SYSTEM

CROSS REFERENCE TO RELATED APPLICATIONS

This application is a non-provisional of, and claims the benefit of the filing date of, U.S. provisional application 63/185,721, filed May 7, 2021, entitled: "APPARATUS AND METHOD OF VOLTAGE DETECTION OF VEHICLES ON A VEHICLE LIFT SYSTEM," the contents of which are incorporated herein by reference.

TECHNICAL FIELD

The present disclosure relates to apparatus and methods of detecting voltages on vehicles. More specifically, the disclosure relates to apparatus and methods of detecting harmful voltages on frames or tires of vehicles on vehicle lift systems.

BACKGROUND

In the automotive industry, high voltage often refers to voltages above 60 volts direct current (VDC). Hybrid and Electric vehicles (such as cars, trucks and busses) often utilize battery packs that may provide between 300 to 1200 VDC. Such high voltage battery packs may pose a shock hazard to technicians that have to service or maintain the electric vehicles.

Additionally, if a hybrid or electric vehicle is involved in an accident, the high voltage battery pack may be inadvertently shorted to the frame of the vehicle. This could impose a high voltage charge anywhere on the vehicle, from the frame to the tires.

Moreover, many technicians don't have any experience working with hybrid or electric vehicles and/or may not be trained in the proper safety procedures of handling such vehicles. Additionally, some hybrids are not necessarily distinguishable from their gas-only counterparts. A mix-up could create serious problems for workers who are not able to tell the difference.

Accordingly, there is a need for a system to automatically detect high voltage electric charges on a vehicle prior to being serviced by a technician.

BRIEF DESCRIPTION

The present disclosure offers advantages and alternatives over the prior art by providing a vehicle lift system that is operable to detect high voltages on a vehicle that is lifted by a vehicle lift and to warn a technician operating the lift prior to the technician servicing the vehicle. Additionally, the disclosure provides a vehicle lift voltage detector apparatus (or kit) that may be attached to a vehicle lift in order to provide the vehicle lift with the capability of detecting and warning a technician of an impending shock hazard on a vehicle that is being lifted by the vehicle lift. Moreover, the disclosure provides a method of detecting harmful voltages on a vehicle that is being lifted by a vehicle lift in order to be serviced by a technician.

A vehicle lift system in accordance with one or more aspects of the present disclosure includes a vehicle lift operable to lift a vehicle to be serviced by a technician. The vehicle lift includes lifting components for engaging and lifting the vehicle at liftable structures of the vehicle. Electrodes are positioned on the lifting components of the vehicle lift. The electrodes are operable to make electrical contact with the liftable structures of the vehicle when the lifting components engage the liftable structures. A voltage detector system is in electrical communication with the electrodes. The voltage detector system is operable to detect voltages at the electrodes capable of harming the technician. The voltage detector system is also operable to send a warning signal to the technician indicating that a harmful voltage has been detected on the electrodes when the electrodes make electrical contact with the liftable structures of the vehicle.

A vehicle lift voltage detector apparatus in accordance with one or more aspects of the present disclosure includes electrodes operable to be attached to lifting components of a vehicle lift. The vehicle lift is operable to lift a vehicle to be service by a technician. The lifting components are operable to engage and lift the vehicle at liftable structures of the vehicle. The electrodes are operable to make electrical contact with the liftable structures of the vehicle when the lifting components engage the liftable structures. A voltage detector system is in electrical communication with the electrodes. The voltage detector system is operable to detect voltages at the electrodes capable of harming the technician. The voltage detector system is also operable to send a warning signal to the technician indicating that a harmful voltage has been detected on the electrodes when the electrodes make electrical contact with the liftable structures of the vehicle.

A method of detecting harmful voltages on a vehicle to be serviced by a technician in accordance with one or more aspects of the present disclosure is presented. The method includes attaching electrodes to lifting components of a vehicle lift. Electrical communication is established between the electrodes and a voltage detector system. A vehicle is engaged and lifted at liftable structures of the vehicle with the lifting components of the vehicle lift. Electrical contact is made between the electrodes and the liftable structures of the vehicle when the lifting components engage the liftable structures. Voltages capable of harming a technician are detected via the voltage detector system. A warning signal is sent via the voltage detector system to the technician indicating that a harmful voltage has been detected on the electrodes.

It should be appreciated that all combinations of the foregoing concepts and additional concepts discussed in greater detail below (provided such concepts are not mutually inconsistent) are contemplated as being part of the inventive subject matter disclosed herein and may be used to achieve the benefits and advantages described herein.

DRAWINGS

The disclosure will be more fully understood from the following detailed description taken in conjunction with the accompanying drawings, in which.

DETAILED DESCRIPTION

Certain examples will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example maybe combined with the features of other examples. Such modifications and variations are intended to be included within the scope of the present disclosure.

The terms "significantly", "substantially", "approximately", "about", "relatively," or other such similar terms that may be used throughout this disclosure, including the claims, are used to describe and account for small fluctuations, such as due to variations in processing from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Figure 1:
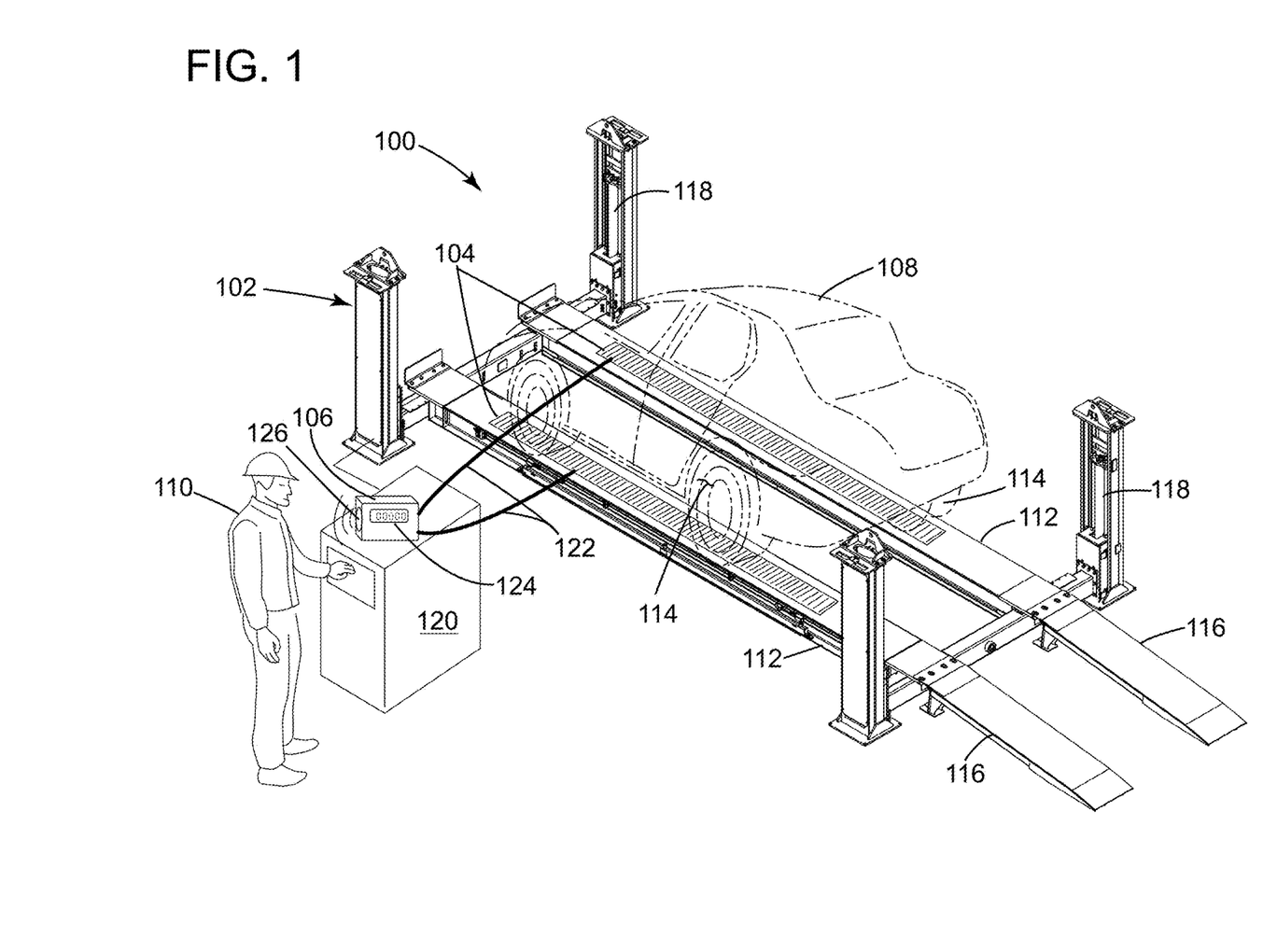
FIG. 1 depicts an example of a perspective view of a vehicle lift system including a four post drive-on vehicle lift, according to aspects described herein.

Referring to FIG. 1, an example is depicted of a perspective view of a vehicle lift system 100 including a four post drive-on vehicle lift 102, according to aspects described herein. The vehicle lift system 100 includes a four post drive-on vehicle lift 102, electrodes 104 attachable to the vehicle lift 102, and a voltage detector system 106 in electrical communication with the electrodes 104.

The four post drive-on vehicle lift 102 is operable to lift a vehicle 108 to be serviced by a technician 110. The vehicle lift 102 includes lifting components 112 for engaging and lifting the vehicle 108 at liftable structures 114 of the vehicle 108. In this case, the lifting components are the runways 112 of the vehicle lift 102 and the liftable structures are the tires 114 of the vehicle 108.

The vehicle lift 102 also includes a pair of ramps 116 to enable the vehicle 108 to drive onto and park on the runways 112. At each corner of the vehicle lift 102 are hydraulic pistons 118 that are hydraulically controlled by the lift control system 120, which the technician 110 operates to raise and lower the runways 112 with the vehicle 108 parked thereon.

Though a four post drive-on vehicle lift is illustrated in the nonlimiting example of FIG. 1, the vehicle lift system may utilize any vehicle lift that is appropriate for the application. For example, and as will be discussed in greater detail herein, the vehicle lift system may include vertical rise drive-on vehicle lifts 202 (FIG. 2), two post vehicle lifts 302 (FIG. 3), mobile column vehicle lifts 402 (FIG. 4), in-ground scissors vehicle lifts 502 (FIGS. 5A and 5B), drive-on vehicle lifts 602 with an attached rolling jacks 604 (FIG. 6) and more.

The electrodes 104 are positioned on the runways 112 of the vehicle lift 102. The electrodes 104 are operable to make electrical contact with the tires 114 of the vehicle 108 when the runways 112 (i.e., lifting components 112) engage the tires 114 (i.e., liftable structures). The electrodes may be conductive electrical tape, sheet metal strips, or any configuration that is appropriate to attach to the lifting components 112 of the vehicle lift 108 and to make electrical contact with the liftable structures 114 of the vehicle 108.

The voltage detector system 106 is in electrical communication with the electrodes 104. In this case, the electrical communication is through connecting wires 122. However, electrical communication between the electrodes 104 and the voltage detector system 106 may also be established remotely and/or wirelessly. The voltage detector system 106 may be a separate system from the lift control system 120, as illustrated in FIG. 1. Alternatively, the voltage detector system 106 may be integrated into the lift control system 120 of the vehicle lift 102.

The voltage detector system 106 is operable to detect voltages at the electrodes 104 that are capable of harming the technician 110. The voltage detector system 106 may include any appropriate system or technology capable of detecting voltage. For example, the voltage detector system 106 may include any of various types of voltmeters or voltage detection circuits.

The voltage detector system 106 can then send a warning signal to the technician 110 indicating that a harmful voltage (e.g., above 60 VDC) has been detected on the electrodes 104 when the electrodes make electrical contact with the liftable structures (e.g., tires 114) of the vehicle 108. The warning signal may be any appropriate audible signal or a visual signal or both. In the example illustrated in FIG. 1, the warning signal is both a digital readout of the measured voltage 124 and an audible buzzer 126. However, other types of warning signals may also be used, for example, a flashing light or a recorded message.

During operation, when a vehicle 108, such as a car, bus, truck or other vehicle, is driven onto the runways 112, the tires 114 will make electrical contact with the electrodes 104. As an industry safety standard, the construction of the tires 114 are made conductive in order to prevent static electric charge from building up on the frame of the vehicle. Therefore, voltages from a damaged battery pack that are inadvertently shorting to the frame of the vehicle may be measured at the tires 114 by the electrical detector system 106. Once the electrical detector system 106 measures a voltage that is above a predetermined threshold, the warning signal (in the form of the digital readout 124 and buzzer 126) will alert the technician that the vehicle may be carrying an electric charge and may pose a shock hazard. Accordingly, the technician 110 can safely take appropriate measures to discharge and/or ground the electric charge.

Though the vehicle lift system 100 is illustrated herein as operable to detect potentially harmful voltages on a vehicle which engages the vehicle lift 102 of the vehicle lift system 100, the vehicle lift system 100 may be operable to perform other functions as well. For example, the vehicle lift system may be operable to automatically discharge or ground the voltage on the vehicle, or the vehicle lift system may be operable to provide a signal that the vehicle is safe to work on. Also, by way of example, the vehicle lift system 100 may be operable to provide specific instructions to the technician to deaden the charge with a hot stick. Also by way of example, the vehicle lift system 100 may be operable to utilize the charge on the vehicle 108 to recharge batteries on the vehicle lift 102, where applicable.

Figure 2:
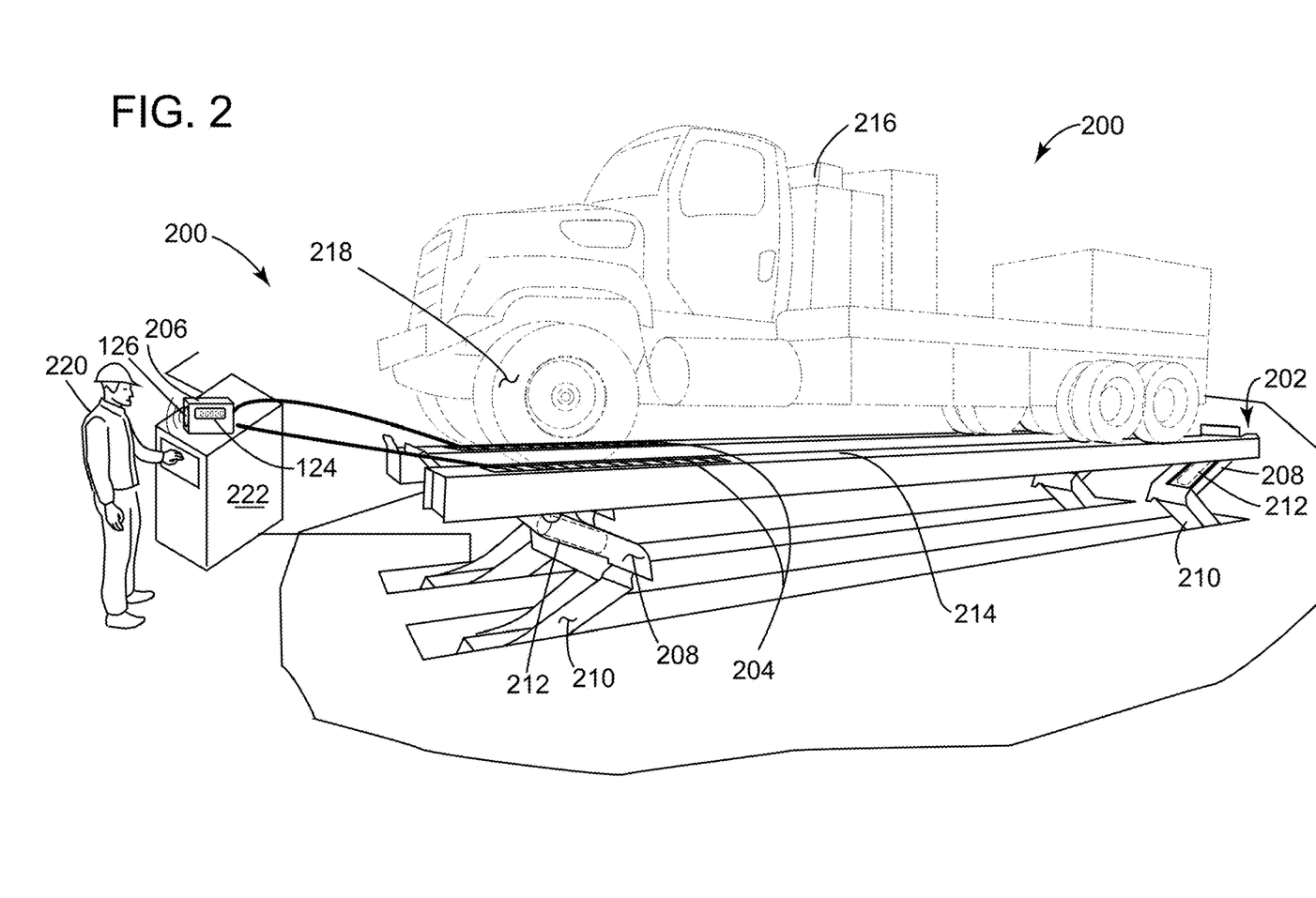
FIG. 2 depicts an example of a perspective view of a vehicle lift system including a vertical rise drive-on vehicle lift, according to aspects described herein.

Referring to FIG. 2, an example is depicted of a perspective view of another vehicle lift system 200 including a vertical rise drive-on vehicle lift 202, according to aspects described herein. The vehicle lift system 200 includes a vertical rise drive-on vehicle lift 202, electrodes 204 attachable to the vehicle lift 202, and a voltage detector system 206 in electrical communication with the electrodes 204.

The vehicle lift system 200, functions similarly to the vehicle lift system 100 of FIG. 1. The main difference is the vertical rise drive-on lift 202, which is another type of drive-on lift. The vertical rise drive-on lift 202 includes four pairs of upper and lower legs 208, 210 that are pivotally attached together. A hydraulic piston 212 is attached to the upper legs 208. As the piston extends, the legs 208, 210 are straightened out to raise the runways 214 of the vehicle lift 202 and lift a vehicle 216. The vehicle lift 202 may be controlled by a technician 220 at a control station 222.

As in the vehicle lift system 100, the electrodes 204 are disposed on the runways 214 of the vehicle lift 202 in order to make electrical contact with the tires 218 of the vehicle 216. If a voltage above a predetermined threshold is detected by the voltage detector system 206, a warning signal will be generated to warn the technician 220.

Figure 3:
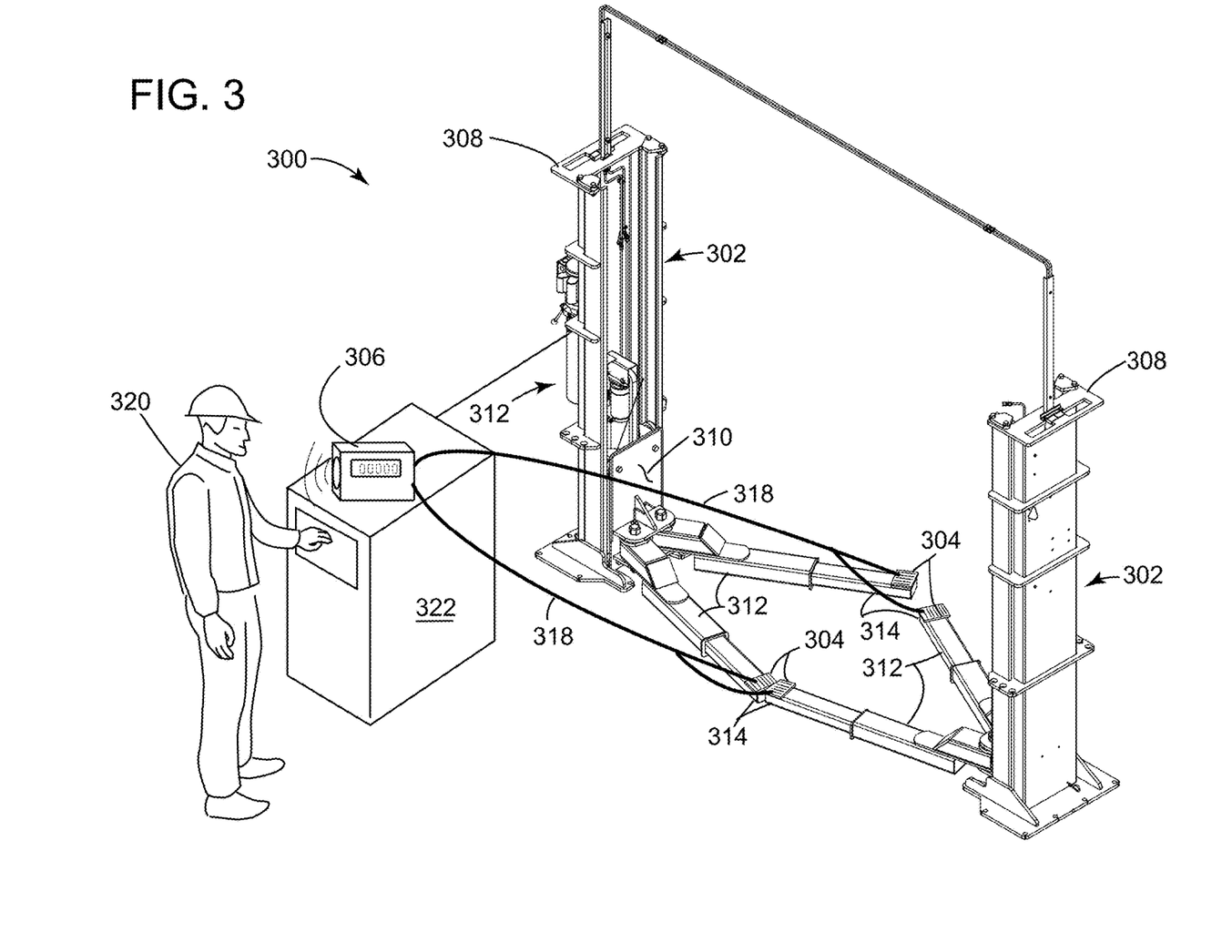
FIG. 3 depicts an example of a perspective view of a vehicle lift system including a two post vehicle lift, according to aspects described herein.

Referring to FIG. 3, an example is depicted of a perspective view of another vehicle lift system 300 including a two post vehicle lift 302, according to aspects described herein. The vehicle lift system 300 includes a two post vehicle lift 302, electrodes 304 attachable to the vehicle lift 302, and a voltage detector system 306 in electrical communication with the electrodes 304.

The two post vehicle lift 302 may be controlled by a technician 320 operating a vehicle lift control system 322. The voltage detector system 306 may be a separate and distinct system from that of the vehicle lift control system 322 or may be fully integrated into the vehicle lift control system 322.

The voltage detector system 306 may be in electrical communication with the electrodes 304 by any of a variety of devices and/or systems that are appropriate for the application. For example, the voltage detector system 306 may be in electrical communication with the electrodes via wires 318, by radio wave or other electromagnetic communication systems, or any other types and/or combinations of wire and wireless communication devices and systems.

The vehicle lift system 300, functions similarly to the vehicle lift system 100 of FIG. 1. The main difference is the two-post vehicle lift 302, and the electrodes 304. The two-post vehicle lift 302 includes a pair of posts 308, which extend longitudinally upwards from a floor and may be substantially parallel to each other.

A carriage 310 is slidably engaged with each post 308. Each carriage 310 is operable to be positioned vertically along its engaged post 308. The carriage 310 may be positioned by hydraulic power, electric power or the like.

A pair of telescopically extendable swing arms 312 are pivotally attached to each carriage 310. Each swing arm 312 is operable to swing in a plane of motion that is substantially perpendicular to the posts 308 and to extend telescopically forward in the plane of motion.

Lift pads 314 are disposed at the distal ends of the swing arms 312. The lift pads 314 are operable to engage and lift a vehicle (not shown) at appropriate portions of the vehicle's frame. The appropriate portions of the vehicle's frame are herein considered to be the liftable structures of the frame of the vehicle. The lift pads 314 may be formed in any number of configurations appropriate for the application and the configuration of the electrodes 304 may change in order to conform to the geometry of the lift pads. For example, the lift pads 314 may have a circular, rectangular or square top surface.

Similar to the vehicle lift system 100, the electrodes 304 are disposed on the lift pads 314 (i.e., the lifting components of the vehicle lift) of the vehicle lift 302 in order to make electrical contact with the liftable structures of the frame of the vehicle. If a voltage above a predetermined threshold is detected by the voltage detector system 306, a warning signal will be generated to warn the technician.

Figure 4:
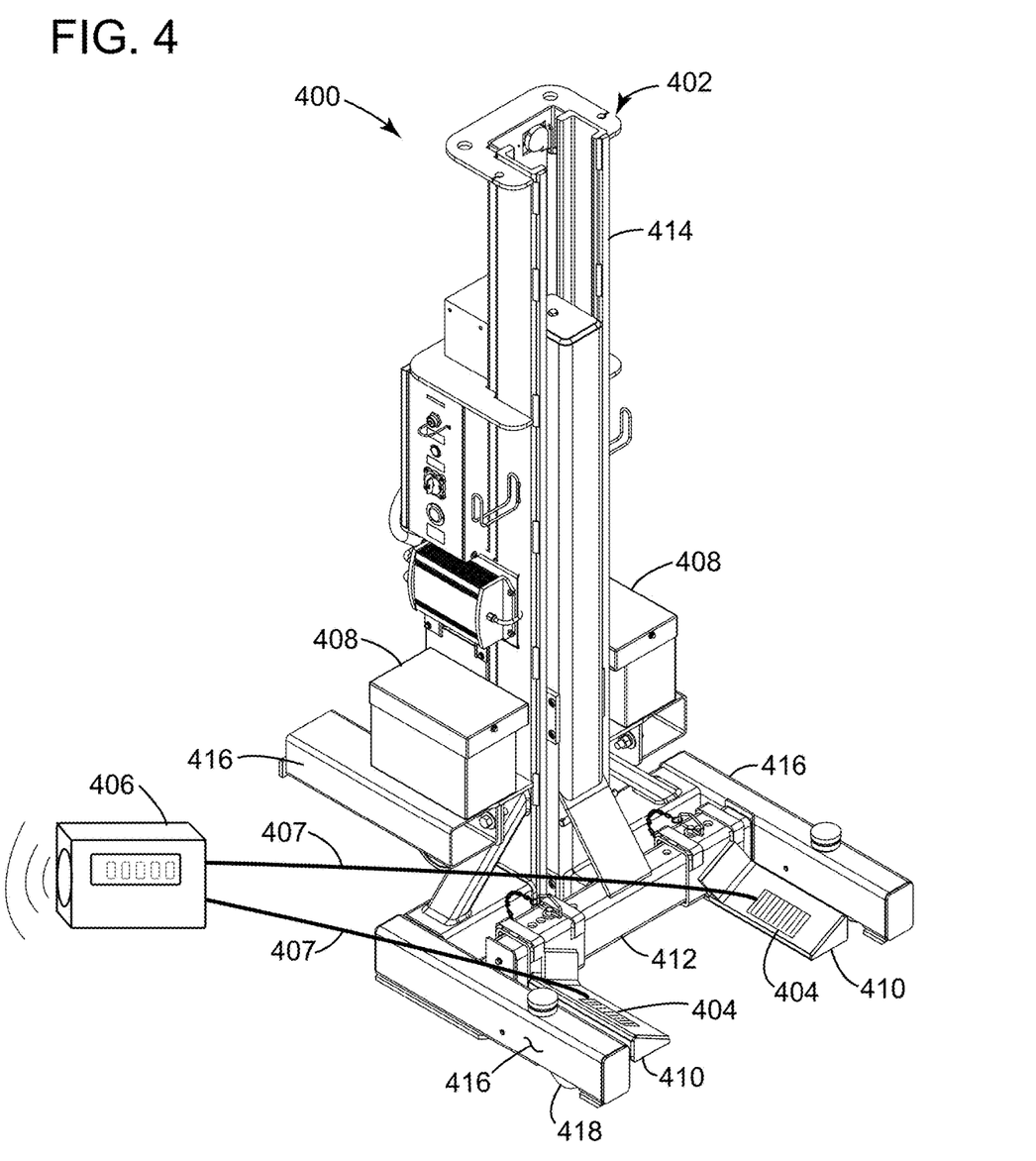
FIG. 4 depicts an example of a perspective view of a vehicle lift system including a mobile column vehicle lift, according to aspects described herein.

Referring to FIG. 4, an example is depicted of a perspective view of another vehicle lift system 400 including a mobile column vehicle lift 402, according to aspects described herein. The vehicle lift system 400 includes a mobile column vehicle lift 402, electrodes 404 attachable to the vehicle lift 402, and a voltage detector system 406 in electrical communication (in this case via wires 407) with the electrodes 404.

The vehicle lift system 400, functions similarly to the vehicle lift system 100 of FIG. 1. The main difference is the mobile column vehicle lift 402, and the electrodes 404. The mobile column vehicle lift 402 includes batteries 408 which provide electrical power for such things as the electronics, motor (not shown) and the hydraulic pump (not shown) of the mobile column vehicle lift 402.

Forks 410 are adjustably positioned on a carriage 412 of the vehicle lift 402. In this case, the forks 410 are slanted so that they may be wedged under the tires (not shown) of a vehicle (not shown), in order to lift the vehicle. That is, the distance between the forks 410 may be adjusted longitudinally along the carriage 412 to accommodate different sized vehicles and to engage with different sized tires. Though the forks 410 are illustrated as slanted to engage with tires of a vehicle, the forks may be configured to engage other liftable structures on the vehicle as well. For example, the forks 410 may be flat in order to engage certain liftable portions of the frame of the vehicle.

The batteries 408 provide the power required to lift and position the carriage 412 vertically along a column 414 of the vehicle lift 402. In this case, the carriage 412 is lifted electrically, however, other forms of power may be utilized to lift the carriage 412. For example, the carriage 412 may be lifted hydraulically.

Outrigger arms 416 are rigidly connected to the vehicle lift 402 to provide a brace to any vehicle load that the forks 410 must lift. Load wheels 418 located at the distal end portions of the outrigger arms 416 enable the vehicle lift 402 to maneuver.

Similar to the vehicle lift system 100, the electrodes 404 are disposed on the forks 410 (i.e., the lifting components of the vehicle lift) of the vehicle lift 402 in order to make electrical contact with the liftable structures of the frame of the vehicle. In this case, the liftable structures are the tires of the vehicle. If a voltage above a predetermined threshold is detected by the voltage detector system 406, a warning signal will be generated to warn the technician (not shown).

Figures 5A, 5B:
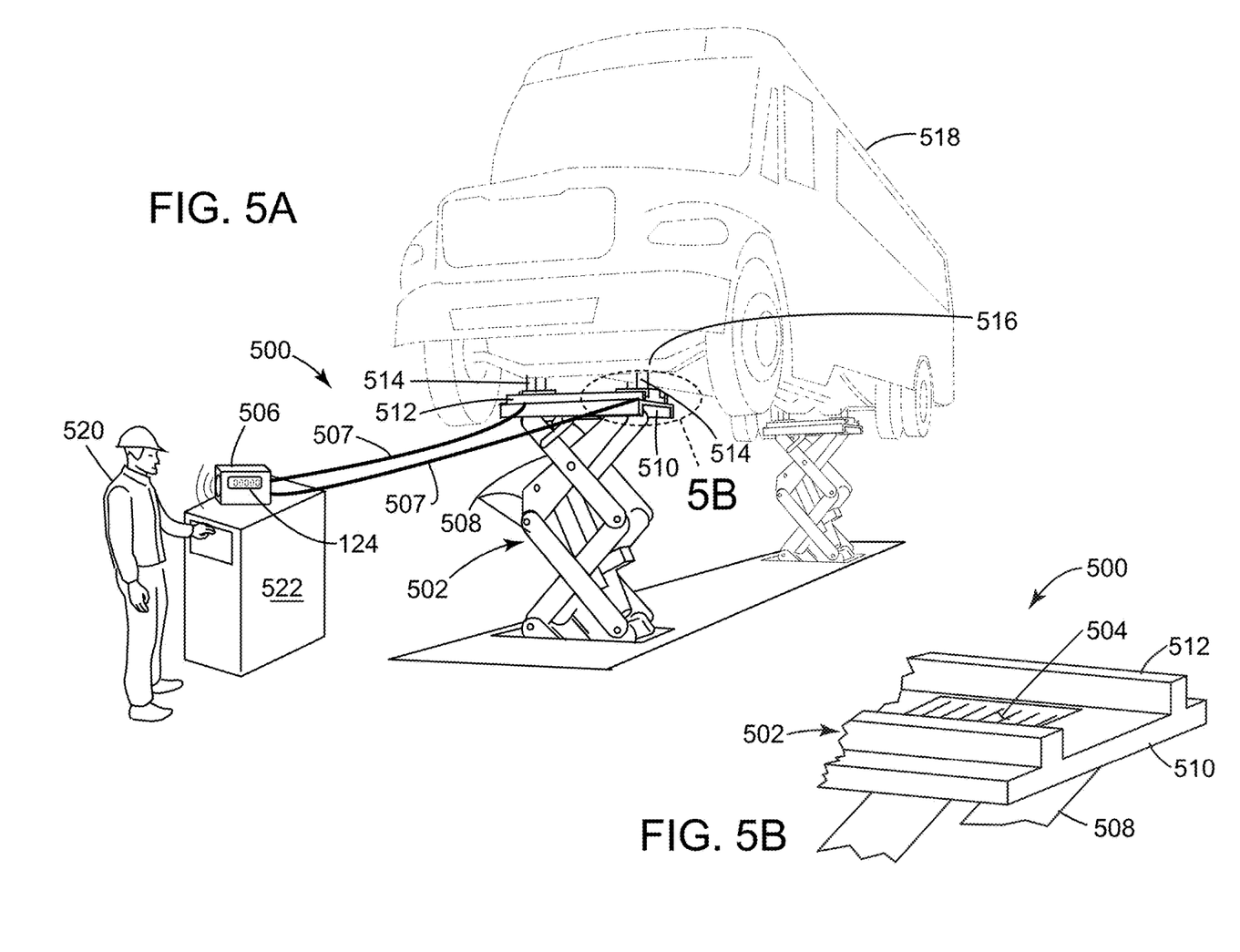
FIG. 5A depicts an example of a perspective view of a vehicle lift system including an in-ground scissors vehicle lift, according to aspects described herein.
FIG. 5B depicts an example of an enlarged top view of the vehicle lift system taken within circle 5B of FIG. 5A, according to aspects described herein.

Referring to FIGS. 5A and 5B, an example is depicted of a perspective view (FIG. 5A) and an enlarged top view (FIG. 5B) of another vehicle lift system 500 including an in-ground scissors vehicle lift 502, according to aspects described herein. The vehicle lift system 500 includes an in-ground scissors vehicle lift 502, electrodes 504 attachable to the vehicle lift 502, and a voltage detector system 506 in electrical communication (in this case via wires 507) with the electrodes 504. A technician 520 may control the vehicle lift 502 with a vehicle lift control system 522.

The voltage detector system 506 is in electrical communication with the electrodes 504. In this case, the electrical communication is through connecting wires 507. However, electrical communication between the electrodes 504 and the voltage detector system 506 may also be established remotely and/or wirelessly. The voltage detector system 506 may be a separate system from the vehicle lift control system 522, as illustrated in FIG. 5A. Alternatively, the voltage detector system 506 may be integrated into the vehicle lift control system 522 of the vehicle lift 502.

The in-ground scissors vehicle lift 502 includes an articulated, scissors like structure of metal legs 508, which are hydraulically powered to raise a top platform 510 from the ground level upwards. The top surface of the platform 510 includes a securing fixture 512, which is operable to be fitted with a variety of adapters 514. The securing fixture 512 may be in a variety of configurations. For example, the fixture may include a pair of parallel longitudinally extending strips disposed on the top surface of the top platform 510 (as illustrated in FIG. 5B) or may be a T-slot embedded in the top surface of the top platform 510, or the like.

The adapters 514 are configured to engage a variety of axles 516 of a variety of different vehicles 518. The electrodes 504 are attached to the securing fixtures 512 and/or the top platform 510. Accordingly, when the adapters 514 engage the axles 516 of a vehicle 518, the electrodes 504 make electrical contact to the axles 516 (i.e., the liftable structures of the vehicle 518) though the adapters 514.

Similar to the vehicle lift system 100, the electrodes 504 are disposed on the securing fixtures 512 (i.e., the lifting components of the vehicle lift) of the vehicle lift 502 in order to make electrical contact with the liftable structures of the vehicle 518. In this case, the liftable structures are the axles 516 of the vehicle 518. If a voltage above a predetermined threshold is detected by the voltage detector system 506, a warning signal will be generated to warn the technician 520.

Though the example illustrated in FIG. 5 of a vehicle lift 502 is an in-ground scissors vehicle lift, it is within the scope of this disclosure that any in-ground vehicle lift appropriate for the application may be used. For example, the vehicle lift 502 may be an in-ground piston lift.

Figure 6:
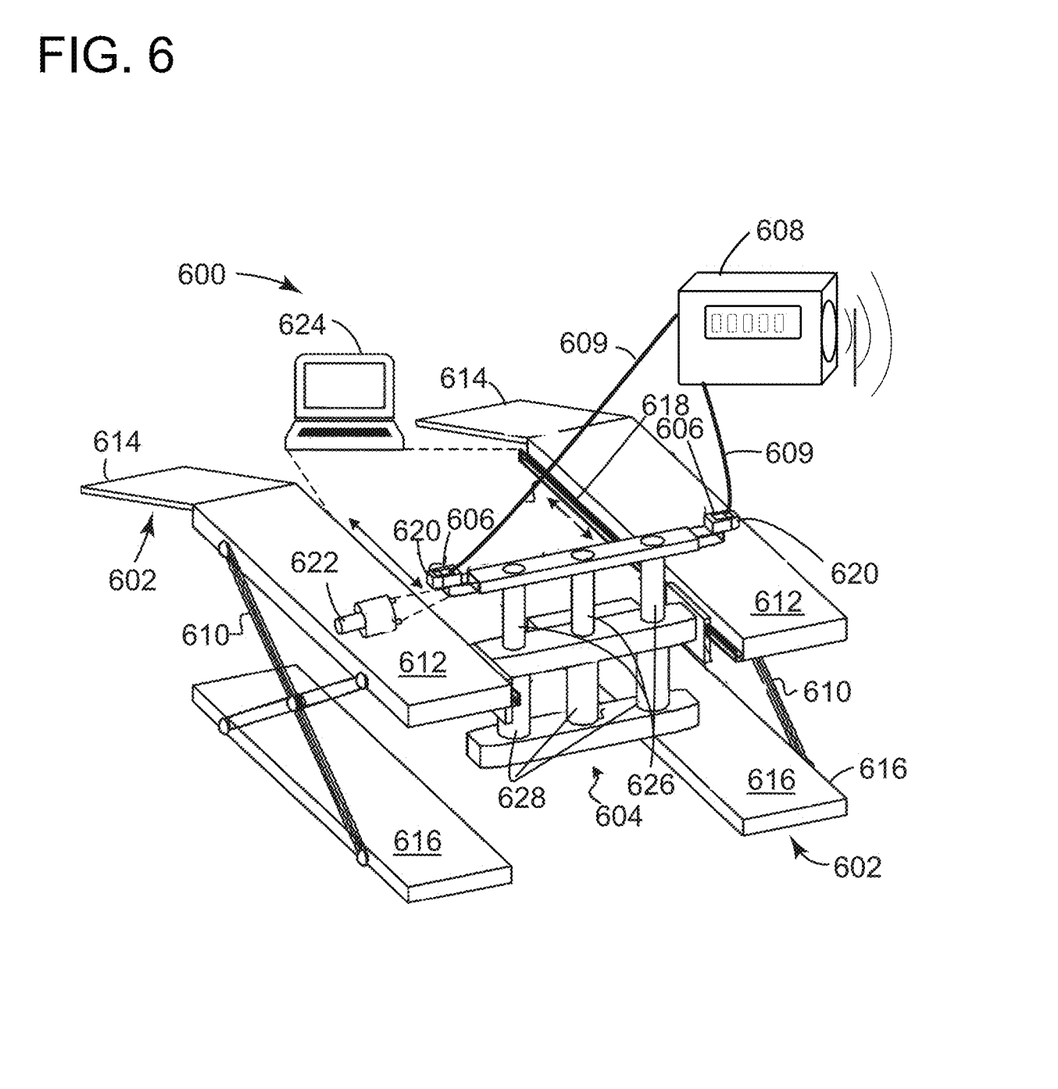
FIG. 6 depicts an example of a perspective view of a vehicle lift system including a drive-on vehicle lift with an attached rolling jack, according to aspects described herein.

Referring to FIG. 6, an example is depicted of a perspective view of another vehicle lift system 600 including a drive-on vehicle lift 602 with an attached automated rolling jack 604, according to aspects described herein. The vehicle lift system 600 includes a drive-on vehicle lift 602 with an attached automated rolling jack 604, electrodes 606 attachable to lift pads 620 of the rolling jack 604, and a voltage detector system 608 in electrical communication (in this case via wires 609) with the electrodes 606.

In this example, the drive-on vehicle lift 602 is lifted with a scissors lift mechanism 610. The drive-on vehicle lift 602 includes a pair of runways 612 with associated ramps 614 and base members 616. The scissors lift mechanism 610 is operable to lift a vehicle parked on the ramps 602 upwards from the base members 616.

The vehicle lift 602 also includes one or more the rolling jacks 604, which is disposed between the runways 612 and movably engaged therewith via tracks 618 that are positioned on the inside edges of the runways 612. The rolling jack 604 is operable to move parallel to the runways 612 to an engagement location underneath the vehicle parked on the runways 612.

The rolling jack 604 includes lift pads 620, which are operable to engage with the liftable structures (e.g., appropriate portions of the frame) of the vehicle. The electrodes 606 are operable to engage with the lift pads 620 and to make electrical contact with the frame of the vehicle when the lift pads 620 engage the frame. The lift pads 620 may be formed in any number of configurations appropriate for the application and the configuration of the electrodes 606 may change in order to conform to the geometry of the lift pads. For example, the lift pads 620 may have a circular, rectangular or square top surface.

The rolling jack 604 may be manually maneuvered or motorized. In this example, the rolling jack 604 is motorized by an electric motor 622, which is in electrical communication with a computerized control system 624. The electric motor 622 drives a transport mechanism to move the rolling jack 604 along the tracks 618. The transport mechanism may utilize any number of drive devices (e.g., wheels, rollers, sprockets or the like) that are appropriate for the application.

The computerized control system 624 may include a programmable logic controller, a microprocessor of the like. The control system 624 is operable to control the raising and lowering of the vehicle lift 602, the positioning of the rolling jack 604 and all other functions of the vehicle lift 602. The control system 624 may also communicate with various cloud systems, or other computerized systems, for purposes of transferring and storing data and operational commands from remote locations and/or entities. Note also, that such a computerized control system 624 may be interfaced with any of the other vehicle lift systems (e.g., 100, 200, 300, 400, 500) described herein.

During operation, the computerized control system 624 will transport the rolling jack 604 to predetermined locations underneath a vehicle parked on the runways 612. Pistons 626 will the be hydraulically extended from cylinders 628 to engage the lift pads 620 with liftable structures of the vehicle. In this example, the liftable structures are appropriate portions of the frame of the vehicle.

Similar to the vehicle lift system 100, the electrodes 606 are disposed on the lift pads (i.e., the lifting components of the vehicle lift) of the rolling jack 604 of the vehicle lift 602 in order to make electrical contact with the liftable structures of the vehicle. In this case, the liftable structures are the appropriate portions of the frame of the vehicle. If a voltage above a predetermined threshold is detected by the voltage detector system 608, a warning signal will be generated to warn the technician.

Figure 7:
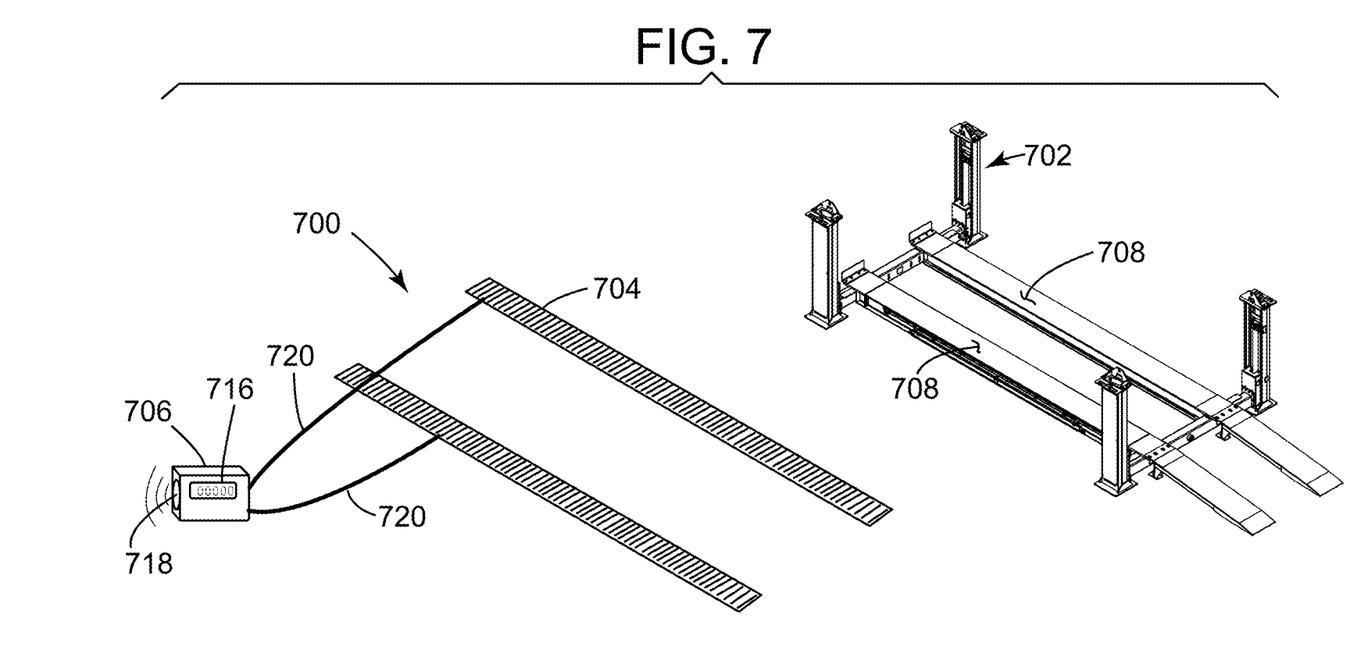
FIG. 7 depicts an example of a schematic diagram of a vehicle lift voltage detector apparatus for a vehicle lift, according to aspects described herein.

Referring to FIG. 7, an example is depicted of a schematic diagram of a vehicle lift voltage detector apparatus 700 for a vehicle lift 702, according to aspects described herein. The vehicle lift voltage detector apparatus 700 is designed as a system or kit, that can be attached to any vehicle lift to provide the type of vehicle lift systems (e.g., 100, 200, 300, 400, 500, 600 and more) that enable a technician to detect high voltages on a vehicle prior to servicing the vehicle. The vehicle lift voltage detector apparatus 700 includes electrodes 704 and a voltage detector system 706.

The electrodes are operable to be attached to lifting components of the vehicle lift 702. In the case of drive-on vehicle lift 702, the lifting components would be the runways 708. The vehicle lift 702 is operable to lift a vehicle (not shown) to be service by a technician (not shown). The lifting components (e.g., runways 708) are operable to engage and lift the vehicle at liftable structures of the vehicle. In the case of the drive-on lift 702, the liftable structures would be the tires (not shown) of the vehicle.

The electrodes 704 are operable to make electrical contact with the liftable structures (e.g., tires) of the vehicle when the lifting components (e.g., runways 708) engage the liftable structures. The electrodes can be any appropriate device that can be attached to the lifting components 708 and make electrical contact with the liftable structures. For example, for the runways 708, the electrodes 704 may be sheet metal strips or conductive electrical tape. Also, by way of example, the electrodes may be configured to attach to various lift pads of a two post vehicle lift, securing fixtures of an in-ground scissors vehicle lift or the like.

The voltage detector system 706 is operable to establish electrical communication with the electrodes 704. Such electrical communication may be by wires 720 or radio signals or the like. The voltage detector system 706 is operable to detect voltages at the electrodes 704 capable of harming the technician and to send a warning signal to the technician indicating that a harmful voltage has been detected on the electrodes 704 when the electrodes make electrical contact with the liftable structures of the vehicle.

The warning signal may be any appropriate audible signal or a visual signal or both. In the example illustrated in FIG. 7, the warning signal is both a digital readout of the measured voltage 716 and an audible buzzer 718. However, other types of warning signals may also be used, for example, a flashing light or a recorded message.

Though the vehicle lift voltage detector apparatus 700 is illustrated herein as operable to detect potentially harmful voltages on a vehicle which engages a vehicle lift 702 that has been fitted with the vehicle lift voltage detector apparatus 700, the vehicle voltage detector apparatus 700 may be operable to perform other functions as well. For example, the vehicle lift voltage detector apparatus 700, once fitted to a vehicle lift 702, may be operable to automatically discharge or ground the voltage on the vehicle, or the vehicle lift voltage detector apparatus may be operable to provide a signal that the vehicle is safe to work on. Also by way of example, the vehicle lift detector apparatus 700, once fitted to a vehicle lift 702, may be operable to provide specific instructions to the technician to deaden the charge with a hot stick. Also by way of example, the vehicle lift detector apparatus 700, once fitted to a vehicle lift 702, may be operable to utilize the charge on the vehicle to recharge batteries on the vehicle lift 702, where applicable.

Figure 8:
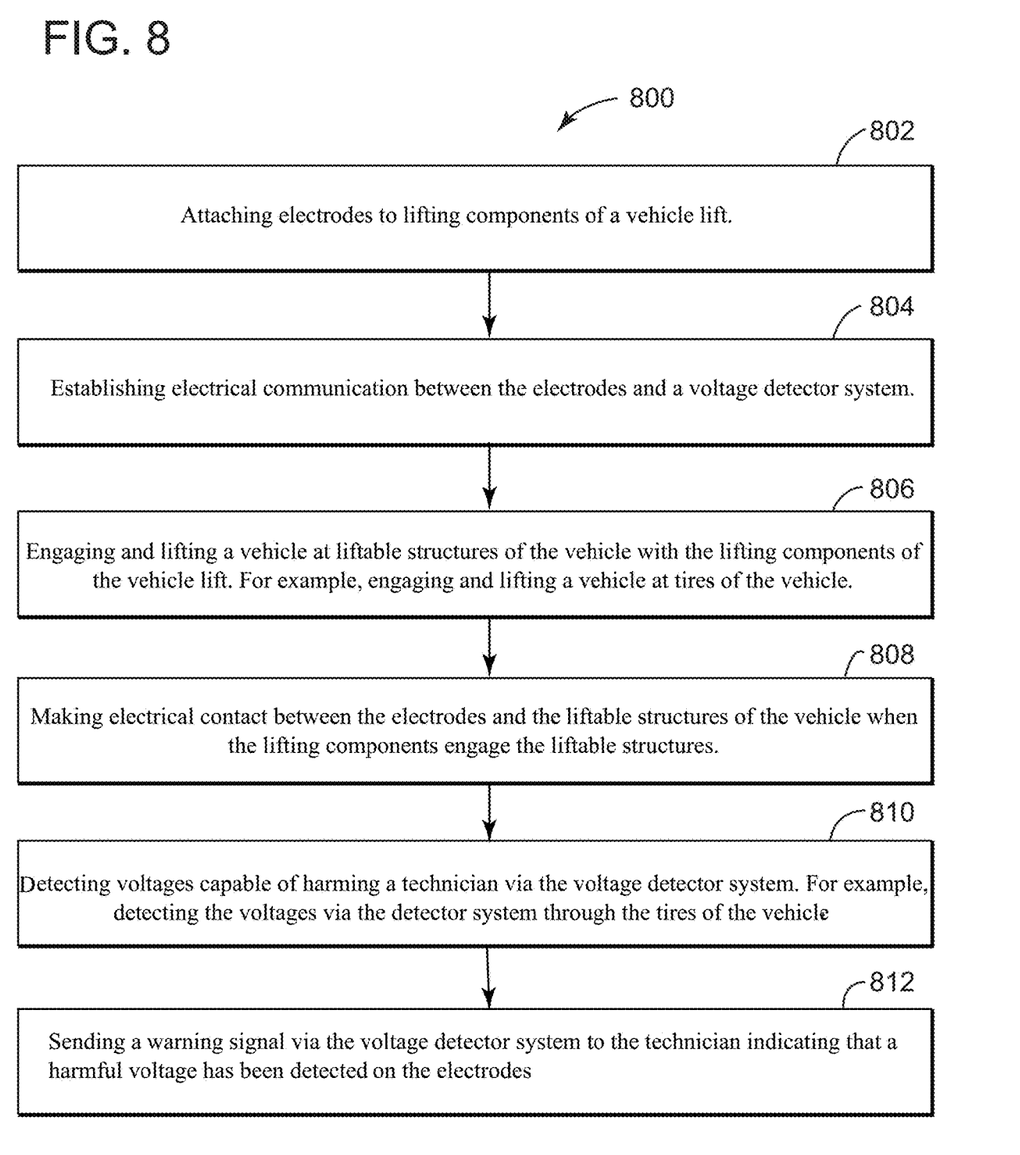
FIG. 8 depicts an example of a schematic diagram of a method of detecting high voltages on a vehicle to be serviced by a technician, according to aspects described herein.

Referring to FIG. 8, an example is depicted of a flow diagram of a method 800 of detecting high voltages on a vehicle to be serviced by a technician, according to aspects described herein. The method 800 begins at 802 wherein electrodes are attached to lifting components of a vehicle lift. For example, referring again to FIG. 1, the electrodes 104 may be metal strips or conductive electrical tape attached to runways 112 of a four post drive-on vehicle lift 102.

At 804, electrical communication is established between the electrodes 104 and a voltage detector system 106. For example, the electrical communication can be done by wires 122 or be electromagnetic signals such as radio waves.

At 806, a vehicle 108 is engaged and lifted at liftable structures of the vehicle 108 with the lifting components 112 of the vehicle lift 102. In the example illustrated in FIG. 1, the liftable structurer are the tires 114 of the vehicle 108.

At 808, electrical contact is made between the electrodes 104 and the liftable structures 114 of the vehicle 108 when the lifting components 112 engage the liftable structures 114. In other words, electrical contact is made between the electrodes (metal strips or electrical conductive tape) 104 and the tires 114 of the vehicle 108, when the runways 112 of the vehicle lift 102 engage the tires 114.

At 810, voltages are detected that are capable of harming a technician 110 via the voltage detector system 106. For example, voltages that are 60 VDC or higher are detected through the tires 114 of the vehicle 108.

At 812, a warning signal is sent via the voltage detector system 106 to the technician 110 indicating that a harmful voltage has been detected on the electrodes 104. For example, a digital readout 124 of the measured voltage is displayed on the voltage detector system 106 and an audible buzzer 126 is generated by the voltage detector system 106.

It should be appreciated that all combinations of the foregoing concepts and additional concepts discussed in greater detail herein (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

Although the invention has been described by reference to specific examples, it should be understood that numerous changes may be made within the spirit and scope of the inventive concepts described. Accordingly, it is intended that the disclosure not be limited to the described examples, but that it have the full scope defined by the language of the following claims.

What is claimed is:

1. A vehicle lift system, comprising:
   A vehicle lift operable to lift a vehicle to be serviced by a technician, the vehicle lift including lifting components for engaging and lifting the vehicle at liftable structures of the vehicle, wherein the vehicle lift comprises:
      runways operable for a vehicle to drive on, and
      a rolling jack disposed between the runways and movably engaged therewith, the rolling jack operable to move parallel to the runways to an engagement location underneath the vehicle parked on the runways, the rolling jack having lift pads operable to engage with the liftable structure of the vehicle, wherein the lifting components include the lift pads,
   electrodes disposed on the lift pads of the rolling jack, the electrodes operable to make electrical contact with the liftable structures of the vehicle when the lift pads engage the liftable structures; and
   a voltage detector system in electrical communication with the electrodes, the voltage detector system operable to detect voltages at the electrodes capable of harming the technician and to send a warning signal to the technician indicating that a harmful voltage has been detected on the electrodes when the electrodes make electrical contact with the liftable structures of the vehicle.

2. The vehicle lift system of claim 1, wherein the electrodes comprise a sheet metal strip or conductive electrical tape attached to a surface of the lifting components of the vehicle lift.

3. The vehicle lift system of claim 1, wherein the voltage detector system is integrated into a lift control system of the vehicle lift.

4. The vehicle lift system of claim 1, wherein the warning signal is an audible signal or a visual signal.

5. The vehicle lift system of claim 1, wherein:
the vehicle lift is a drive on lift.

6. The vehicle lift system of claim 5, wherein the vehicle lift is one of a four post drive-on runway lift or a vertical rise drive-on lift.

7. The vehicle lift system of claim 1, wherein:
the vehicle lift is an in-ground scissors lift.

* * * * *